United States Patent
Wu et al.

(10) Patent No.: US 8,669,174 B2
(45) Date of Patent: Mar. 11, 2014

(54) MULTI-DIE STACKING USING BUMPS WITH DIFFERENT SIZES

(71) Applicant: Taiwan Semiconductor Manufacturing Company, Ltd., Hsin-Chu (TW)

(72) Inventors: Weng-Jin Wu, Hsin-Chu (TW);
Ying-Ching Shih, Taipei (TW);
Wen-Chih Chiou, Miaoli (TW);
Shin-Puu Jeng, Hsin-Chu (TW);
Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/732,543

(22) Filed: Jan. 2, 2013

(65) Prior Publication Data
US 2013/0122700 A1   May 16, 2013

Related U.S. Application Data

(62) Division of application No. 12/840,949, filed on Jul. 21, 2010, now Pat. No. 8,581,418.

(51) Int. Cl.
  *H01L 21/44*   (2006.01)
(52) U.S. Cl.
  USPC .......................................... 438/613; 438/108
(58) Field of Classification Search
  USPC ................................................ 438/613, 108
  See application file for complete search history.

(56) References Cited

U.S. PATENT DOCUMENTS

| | | | |
|---|---|---|---|
| 4,811,082 | A | 3/1989 | Jacobs et al. |
| 4,990,462 | A | 2/1991 | Sliwa, Jr. |
| 5,075,253 | A | 12/1991 | Sliwa, Jr. |
| 5,380,681 | A | 1/1995 | Hsu |
| 5,385,869 | A | 1/1995 | Liu et al. |
| 5,481,133 | A | 1/1996 | Hsu |
| 6,002,177 | A | 12/1999 | Gaynes et al. |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,339,254 | B1 | 1/2002 | Venkateshwartan et al. |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |

(Continued)

FOREIGN PATENT DOCUMENTS

CN   1956190 A   5/2007

*Primary Examiner* — Douglas Menz
(74) *Attorney, Agent, or Firm* — Slater & Matsil, L.L.P.

(57) ABSTRACT

A device includes a first die having a first side and a second side opposite to first side, the first side includes a first region and a second region, and a first metal bump of a first horizontal size formed on the first region of the first side of the first die. A second die is bonded to the first metal bump at the first side of the first die. A dielectric layer is formed over the first side of the first die and includes a first portion directly over the second die, a second portion covering the second die. A second metal bump of a second horizontal size greater than the first horizontal size is formed on the second region of the first side of the first die. An electrical component is bonded to the first side of the first die through the second metal bump.

20 Claims, 8 Drawing Sheets

(56) References Cited

U.S. PATENT DOCUMENTS

| | | |
|---|---|---|
| 6,558,978 B1 | 5/2003 | McCormick |
| 6,562,653 B1 | 5/2003 | Ma et al. |
| 6,570,248 B1 | 5/2003 | Ahn et al. |
| 6,600,222 B1 | 7/2003 | Levardo |
| 6,607,938 B2 | 8/2003 | Kwon et al. |
| 6,661,085 B2 | 12/2003 | Kellar et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,958,537 B2 | 10/2005 | Eng et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,667,313 B2 | 2/2010 | Kawabata et al. |
| 7,834,450 B2 | 11/2010 | Kang |
| 8,138,017 B2 | 3/2012 | Chin |
| 2003/0230801 A1 | 12/2003 | Jiang et al. |
| 2005/0012225 A1 | 1/2005 | Choi et al. |
| 2007/0278675 A1 | 12/2007 | Okada |
| 2009/0286108 A1 | 11/2009 | Kim et al. |
| 2010/0102428 A1 | 4/2010 | Lee et al. |

MULTI-DIE STACKING USING BUMPS WITH DIFFERENT SIZES

This application is a divisional of U.S. patent application Ser. No. 12/840,949, entitled "Multi-Die Stacking Using Bumps with Different Sizes" filed on Jul. 21, 2010, which application is hereby incorporated herein by reference.

TECHNICAL FIELD

This disclosure relates generally to integrated circuits, and more particularly to three-dimensional integrated circuits (3DIC) comprising interposers and the method of forming the same.

BACKGROUND

The integrated circuits have experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

The volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required. An additional limitation comes from the significant increase in the number and length of interconnections between devices as the number of devices increases. When the number and length of interconnections increase, both circuit RC delay and power consumption increase.

Three-dimensional integrated circuits (3DIC) were thus formed, wherein dies may be stacked, with wire-bonding, flip-chip bonding, and/or through-silicon vias (TSV) being used to stack the dies together and to connect the dies to package substrates. In conventional die-stacking methods, situation may arise that when two dies are bonded to another die, the two dies may require different bump sizes, which causes the difficulty in subsequent bonding, solder bump re-flowing, underfill filling, and wafer sawing steps.

SUMMARY

In accordance with one aspect, a device includes a first die having a first side and a second side opposite to first side, the first side includes a first region and a second region, and a first metal bump of a first horizontal size formed on the first region of the first side of the first die. A second die is bonded to the first side of the first die through the first metal bump. A dielectric layer is formed over the first side of the first die and includes a first portion directly over the second die, a second portion encircling the second die, and an opening exposing the second region of the first side of the first die. A second metal bump of a second horizontal size is formed on the second region of the first side of the first die and extending into the opening of the dielectric layer. The second horizontal size is greater than the first horizontal size. An electrical component is bonded to the first side of the first die through the second metal bump.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel three-dimensional integrated circuit (3DIC) and the method of forming the same are provided. The intermediate stages of manufacturing an embodiment are illustrated. The variations of the embodiment are discussed. Throughout the various views and illustrative embodiments, like reference numbers are used to designate like elements.

Figure 1:
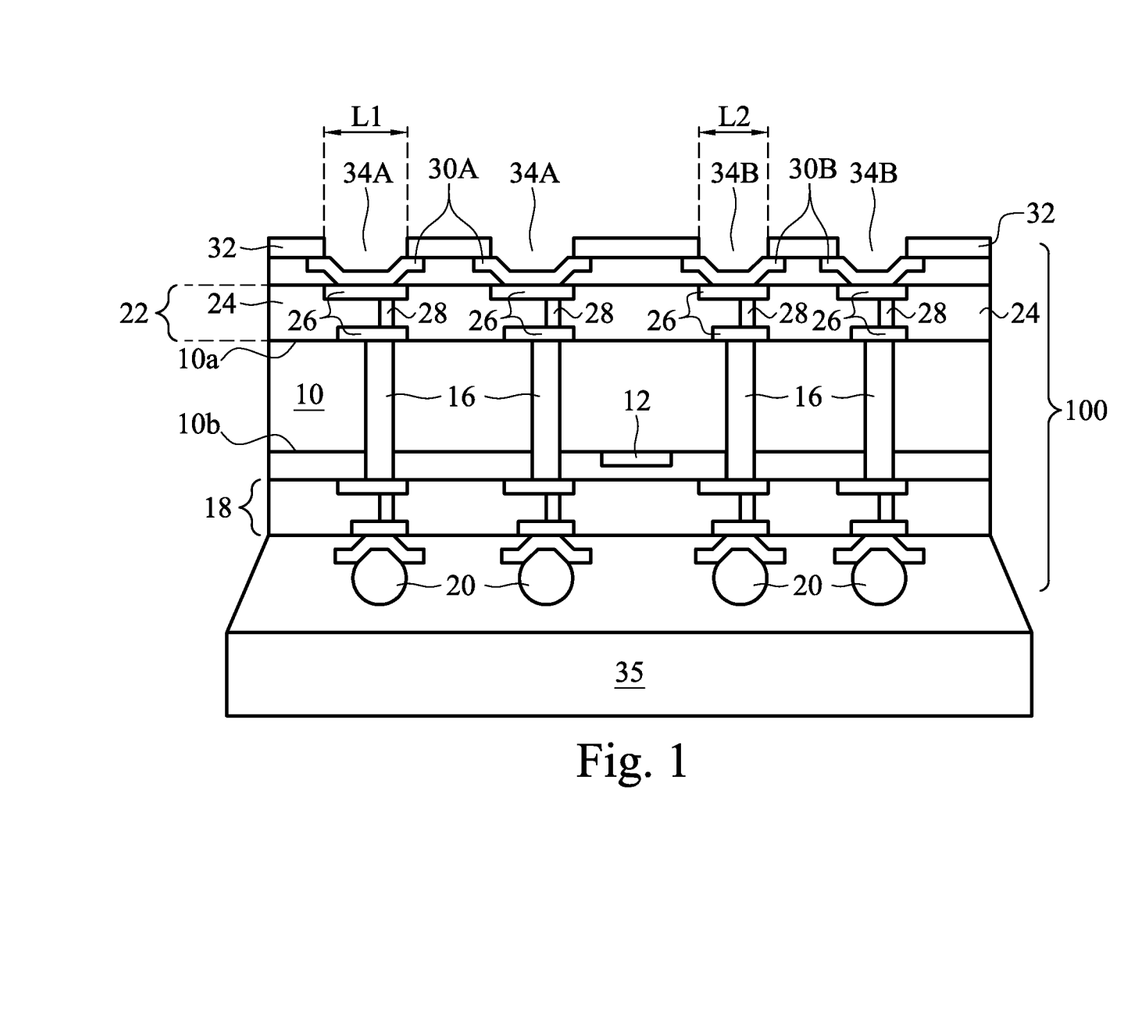
FIGS. 1 through 8 are cross-sectional views of intermediate stages in the formation of a three-dimensional integrated circuit (3DIC) including stacked dies, wherein metal bumps having different sizes are formed on a same die/wafer.

Referring to FIG. 1, wafer 100, which includes substrate 10 therein, is provided. Substrate 10 may be formed of a semiconductor material, such as silicon, silicon germanium, silicon carbide, gallium arsenide, or other commonly used semiconductor materials. In an embodiment, wafer 100 is a device wafer comprising integrated circuits 12, which may include complementary metal-oxide-semiconductor (CMOS) transistors, resistors, inductors, capacitors, and/or the like. In alternative embodiments, wafer 100 is an interposer wafer that is substantially free from active devices such as transistors. Furthermore, interposer wafer 100 may include, or may be free from, passive devices such as capacitors, resistors, inductors, and/or the like. Accordingly, substrate 10 may be formed of a dielectric material such as silicon oxide.

Through-substrate vias (TSV) 16 are formed in substrate 10, and may be electrically insulated from substrate 10 by insulation layers (not shown). TSVs 16 penetrate from one side of substrate 10 to the opposite side. In an embodiment, wafer 100 is a device wafer, and the substrate 10 has a first side 10a and a second side 10b opposite to the first side 10a. In integration process, the second side 10b is referred to as the frontside of the substrate, and the first side 10a is referred to as the backside of the substrate 10. Interconnect structure 18, which includes metal lines and vias (not shown) formed therein, is formed on the second side 10b of substrate 10 and electrically coupled to integrated circuits 12. The metal lines and vias may be formed of copper or copper alloys, and may be formed using the well-known damascene processes. Interconnect structure 18 may include a commonly known inter-layer dielectric (ILD) and inter-metal dielectrics (IMDs), which may be low-k dielectric layers having low k values, for example, lower than about 2.5, or even lower than about 2.0. In alternative embodiments, the side of wafer 100 facing up is the front side of device wafer 100, while the side facing down is the bottom side. Metal bumps 20, which may be solder bumps, are formed at a surface of wafer 100, and may be electrically coupled to integrated circuits 12.

Interconnect structure 22 is formed on the first side 10a of substrate 10. Interconnect structure 22 includes one or more dielectric layer(s) 24, and metal lines 26 and vias 28 in dielectric layer(s) 24. Metal lines 26 and vias 28 are referred to as redistribution lines (RDLs) hereinafter. Dielectric layers 24 may be formed of polyimide, silicon nitride, organic dielectric materials, low-k dielectric materials, or the like. RDLs 26/28 may be formed of copper or copper alloys, although other commonly used metals such as aluminum, tungsten, or the like, may also be used.

Under-bump-metallurgies (UBMs) 30 (including 30A and 30B) are formed and electrically coupled to RDLs 26/28. UBMs 30 may be formed of aluminum copper alloy, aluminum, copper, or the like, and each of UBMs 30 may also include a nickel layer over a copper-containing layer. Dielectric layer 32 is formed to cover edge portions of UBMs 30, with the central portions of UBMs 30 exposed through UBM openings 34A and UBM openings 34B. UBM openings 34A are referred to as large UBM openings, while UBM openings 34B are referred to as small UBM openings, although they are formed simultaneously. In an exemplary embodiment, the horizontal size (which may be a length or a width) L1 of UBM openings 34A is greater than the horizontal size L2 of UBM openings 34B, with ratio L1/L2 being greater than about 5, or even greater than about 10, for example. Carrier 35, which may be a glass wafer, may be bonded to a side of wafer 100.

Figure 2:
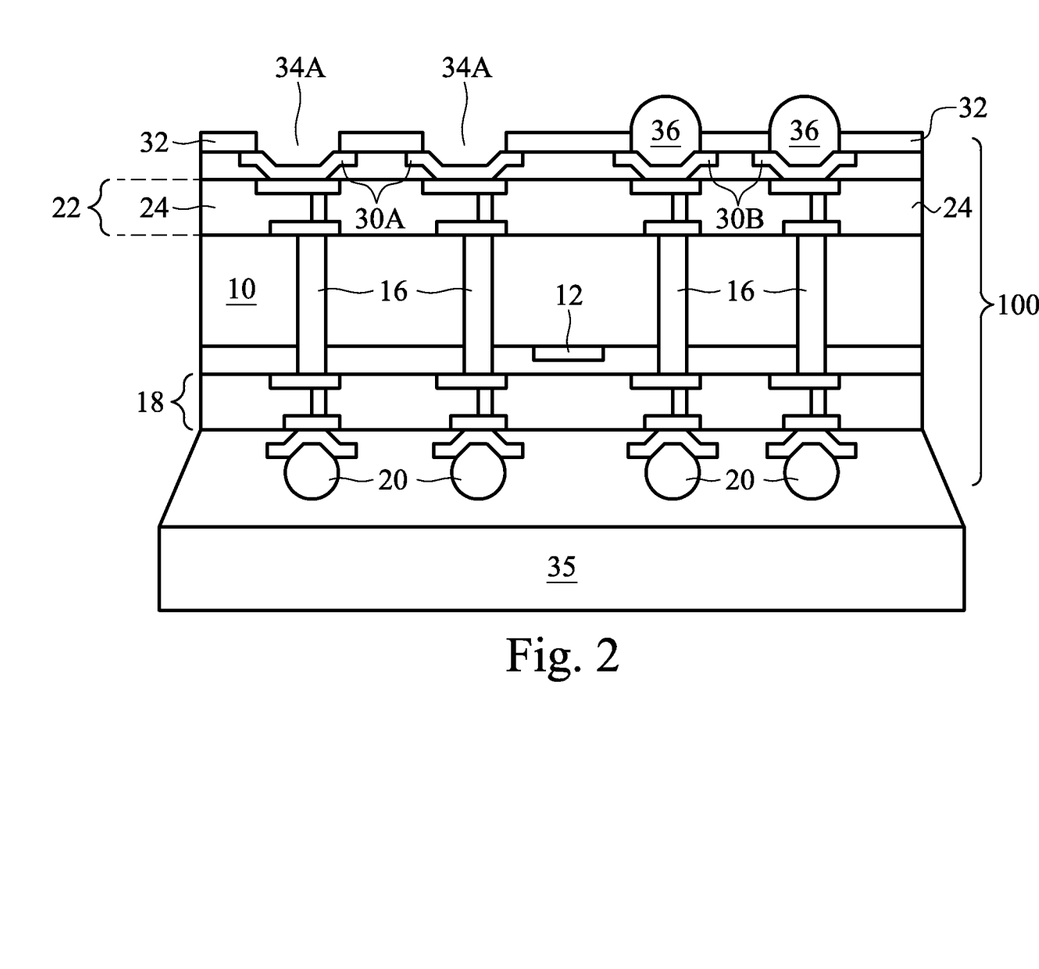

Next, as shown in FIG. 2, small metal bumps 36 are formed, wherein a portion of each of small metal bumps 36 is in one of small UBM openings 34B. Small metal bumps 36 are electrically coupled to RDLs 26/28, and may be electrically coupled to TSVs 16. In an embodiment, small metal bumps 36 are solder bumps such as eutectic solder bumps. In alternative embodiments, small metal bumps 36 are copper bumps or other metal bumps formed of gold, silver, nickel, tungsten, aluminum, and/or alloys thereof. When formed of copper, each of small metal bumps 36 may also be covered by a nickel layer, and/or a solder cap on the nickel layer (not shown).

Figure 3:
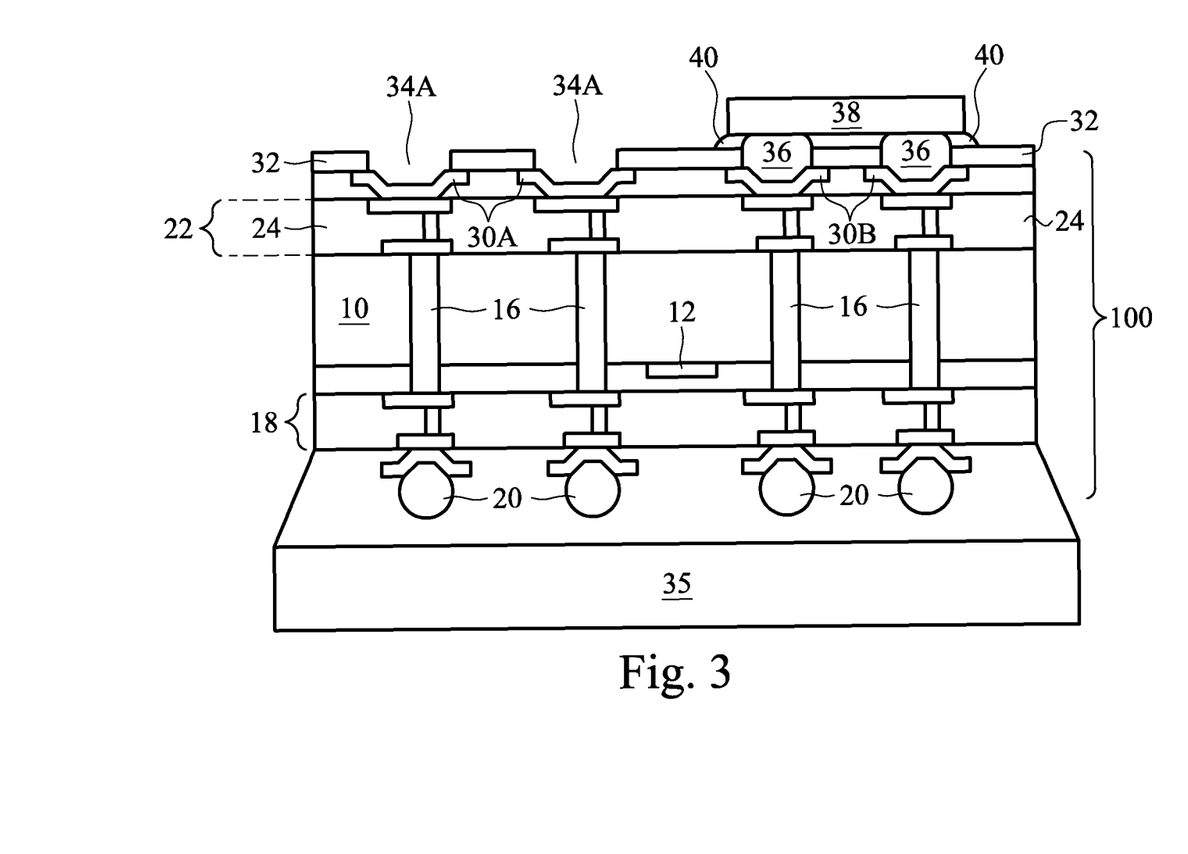

In FIG. 3, die 38 is bonded to small metal bumps 36. Die 38 may be a device die comprising integrated circuit devices, such as transistors, capacitors, inductors, resistors (not shown), and the like, therein, and may be a logic die or a memory die. Depending on the structure of small metal bumps 36, the bonding between die 38 and metal bumps 36 may be a solder bonding or a direct metal-to-metal (such as a copper-to-copper) bonding. After die 38 is bonded to small metal bumps 36, underfill 40 is dispensed into the gap between die 38 and wafer 100, and is then cured.

Figure 4:
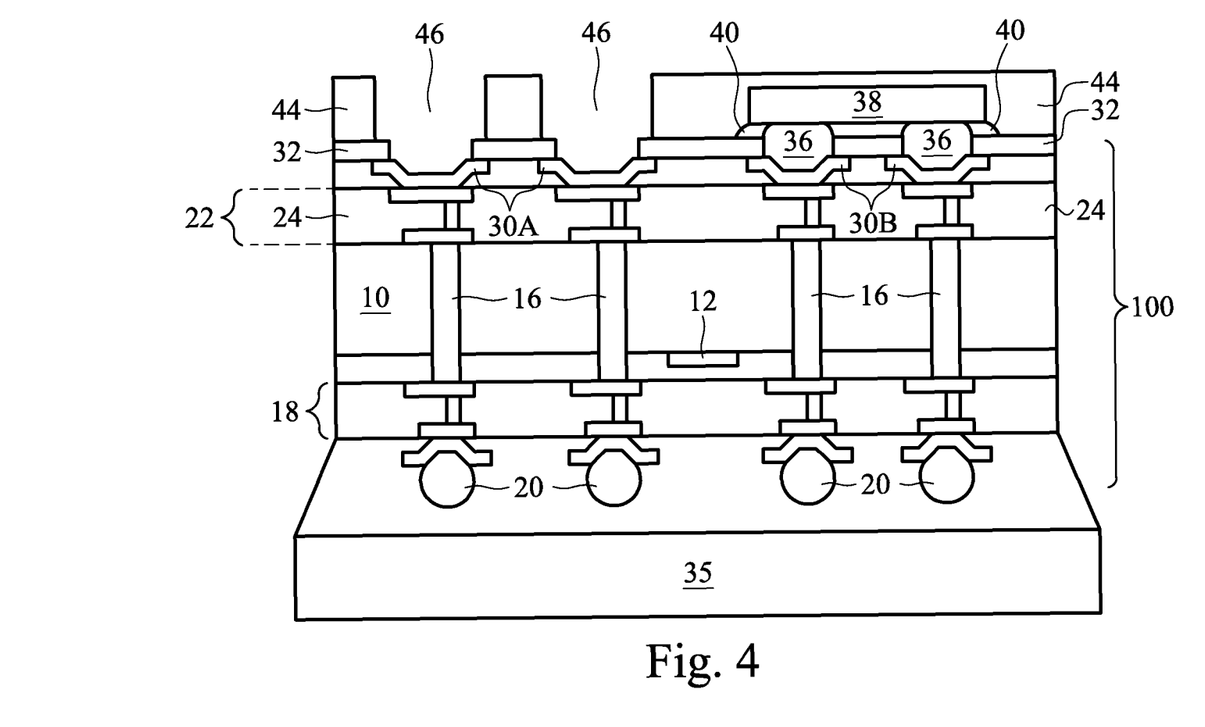

Referring to FIG. 4, dielectric layer 44 is coated on wafer 100 and die 38. Dielectric layer 44 may be a solder resist coating, which may be formed of a photo resist, a polymer, or polymer-like material. Alternatively, dielectric layer 44 may be formed of silicone, spin-on glass (SOG), solder resist, or the like. Dielectric layer 44 may include a portion directly over die 38, and a portion encircling die 38, small metal bumps 36, and underfill 40. Accordingly, dielectric layer 44 protects small metal bumps 36 and the bonding between die 38 and wafer 100. Dielectric layer 44 may be formed using spin coating, spray coating, or ink jet print, followed by a curing step. Openings 46 are then formed in dielectric layer 44, for example, using etching, so that UBMs 30A are exposed.

Figure 5:
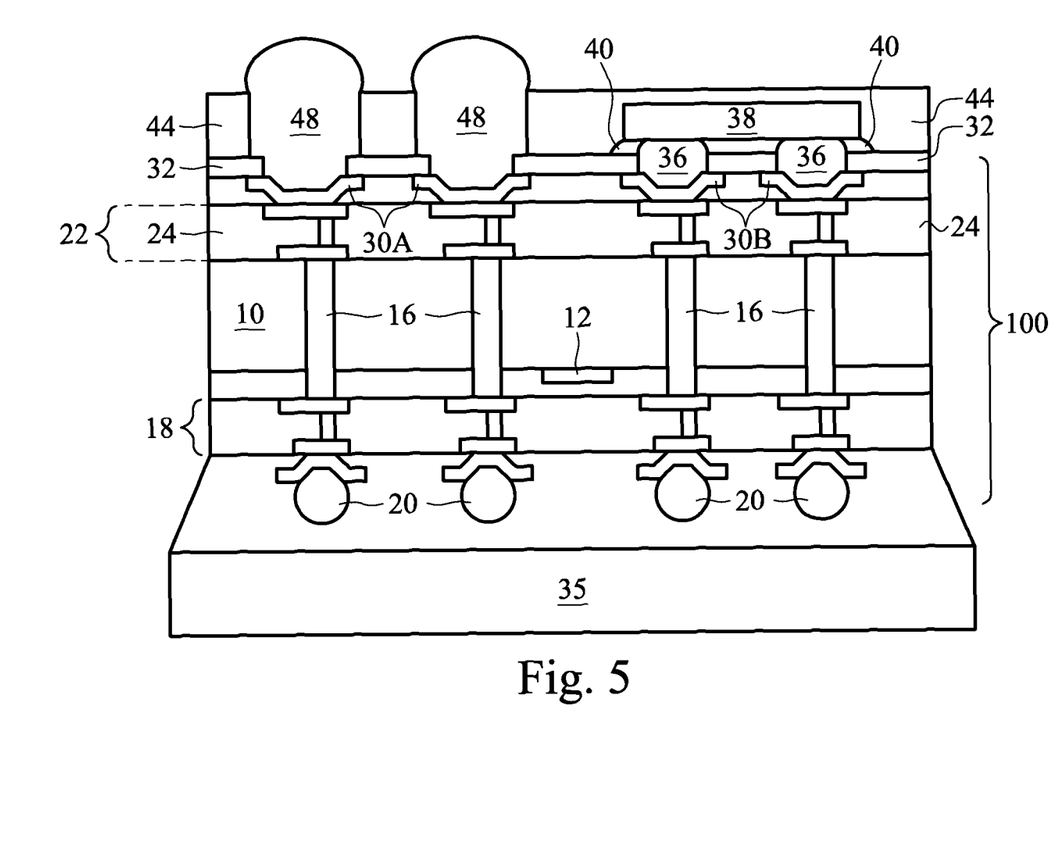

Next, as shown in FIG. 5, large metal bumps 48 are formed in openings 46, and may contact dielectric layer 44. In an embodiment, large metal bumps 48 are solder bumps, which may be formed of a eutectic solder, a lead-free solder, or the like. In alternative embodiments, large metal bumps 48 are copper bumps, and may have nickel layers and/or solder caps thereon.

Figure 6:
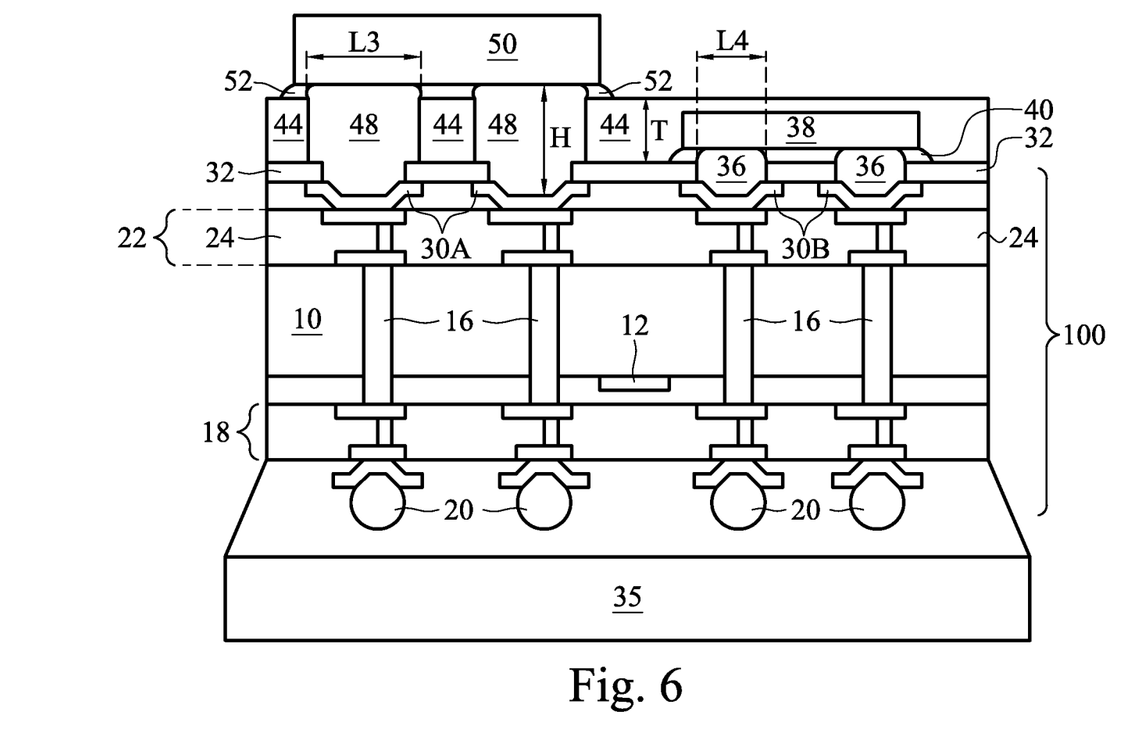

Next, as shown in FIG. 6, electrical component 50 is bonded to large metal bumps 48. In an embodiment, electrical component 50 is a device die including integrated circuits such as transistors therein. In alternative embodiments, electrical component 50 is a package substrate. In the embodiments large metal bumps 48 are solder bumps, a re-flow may be performed to join electrical component 50 to large metal bumps 48. After the bonding, the bottom surface of electrical component 50 may be higher than the top surface of dielectric layer 44. Underfill 52 is then filled into the gap between electrical component 50 and wafer 100, and between large metal bumps 48. It is realized that although only one die 38 and one die (electrical component) 50 is illustrated, there may be a plurality of dies 38 and dies 50 bonded to wafer 100. A die saw may be performed at this time to separate wafer 100 into a plurality of dies, each including die 100' (please refer to FIG. 7), which is a part of wafer 100, one of dies 38, and one of dies 50.

After the bonding of electrical component 50 to wafer 100, the horizontal size (which may be a length or a width) L3 of large metal bumps 48 is greater than the horizontal size L4 of small metal bumps 36, with ratio L3/L4 being greater than about 5, or even greater than about 15, for example. Further, height H of large metal bumps 48 is greater than thickness T of dielectric layer 44.

Figure 7:
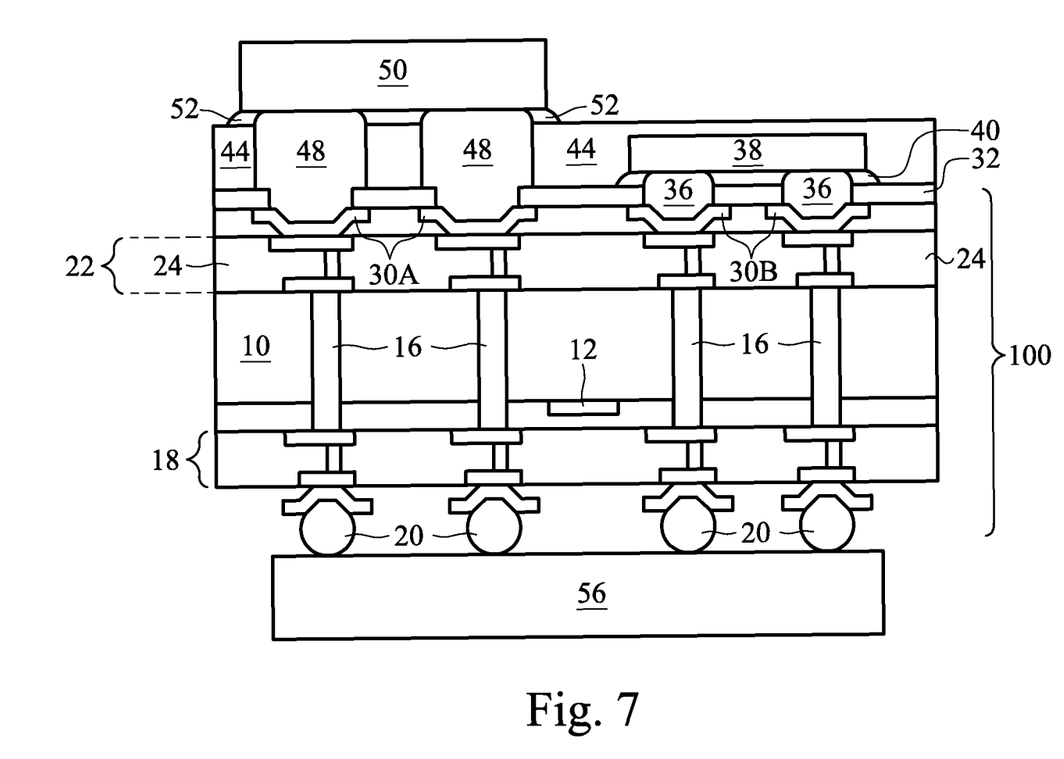
Figure 8:
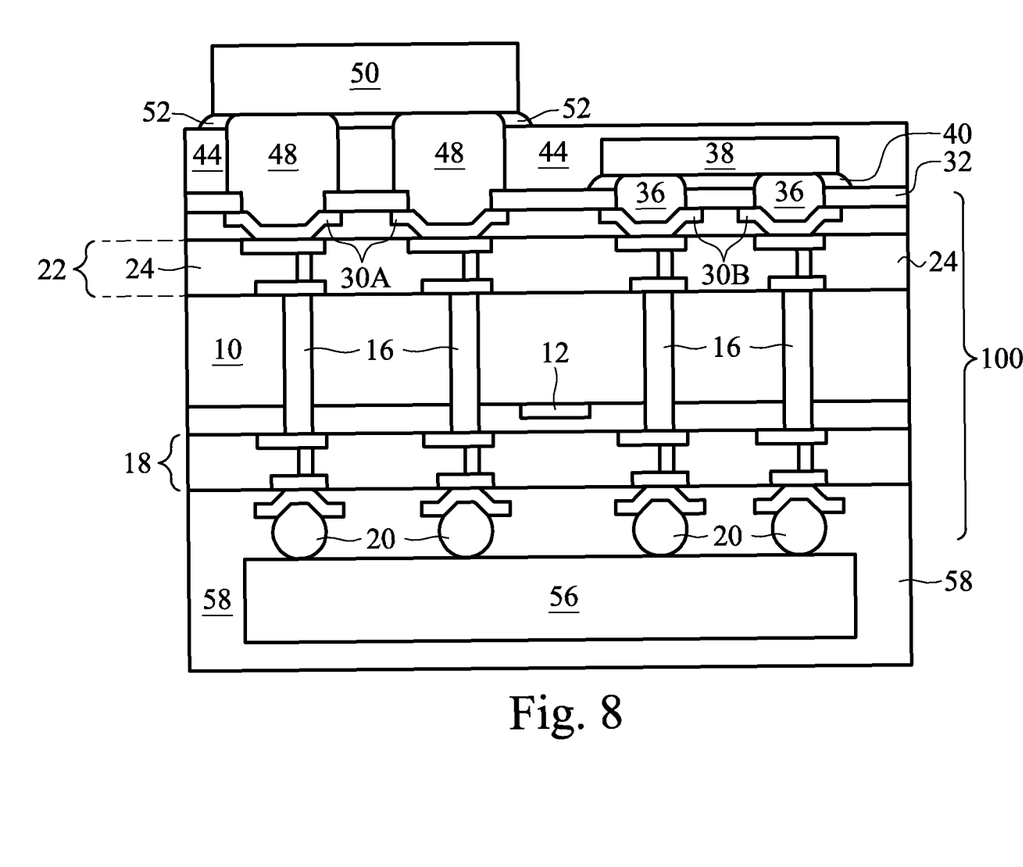

Referring to FIG. 7, carrier 35 is de-bonded, and electrical component 56, which may be a device die or a package substrate, is bonded to wafer 100, wherein electrical component 56 and die 38 are on opposite sides of wafer 100 (or die 100'). Optionally, as shown in FIG. 8, when electrical component 56 is a device die, molding compound 58 may be formed to cover electrical component 56. A die saw may then be performed to separate wafer 100 into a plurality of dies if the die saw has not been performed yet.

In the embodiments, large metal bumps and small metal bumps are formed in a same 3DIC. Since the small metal bumps are protected by a dielectric material, the large metal bumps may be formed, and another die may be bonded to the large metal bumps after the formation and the bonding of the small metal bumps, and no damage occurs to the small metal bumps during the bonding of the large metal bumps. This provides the flexibility in the stacking of dies.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a device, the method comprising:
   providing a wafer;
   forming a first under-bump-metallurgy (UBM) and a second UBM over the wafer;
   forming a first metal bump over and electrically coupled to the first UBM;
   bonding a first die to the first metal bump;
   forming a solder resist coating covering the first die and the wafer, the solder resist coating having a bottommost surface disposed above an uppermost surface of the second UBM;
   forming an opening in the solder resist coating to expose at least a portion of the second UBM; and
   forming a second metal bump in the opening and electrically coupled to the second UBM, wherein the second metal bump is larger than the first metal bump.

2. The method of claim 1, wherein a portion of the second metal bump extends over the solder resist coating.

3. The method of claim 1, further comprising forming a plurality of through vias inside the wafer.

4. The method of claim 1, further comprising bonding an electrical component to the second metal bump, wherein electrical component is a device die or a package substrate.

5. The method of claim 4, wherein after the step of bonding the electrical component, a ratio of a horizontal size of the second metal bump to a horizontal size of the first metal bump is greater than about 5.

6. The method of claim 1, further comprising filling an underfill between the wafer and the first die before the step of forming the solder resist coating.

7. A method of forming a device, the method comprising:
   providing a wafer;
   forming a first under-bump-metallurgy (UBM) and a second UBM over the wafer;
   forming a first metal bump over and electrically coupled to the first UBM;
   bonding a first die to the first metal bump;
   forming a dielectric layer covering the first die and the wafer;
   forming an opening in the dielectric layer to expose at least a portion of the second UBM; and
   forming a second metal bump in the opening and electrically coupled to the second UBM, wherein the second metal bump is larger than the first metal bump, and wherein the second bump extends below a bottommost surface of the dielectric layer.

8. The method of claim 7, wherein a portion of the second metal bump extends over the dielectric layer.

9. The method of claim 7, further comprising forming a plurality of through vias inside the wafer.

10. The method of claim 7, further comprising bonding an electrical component to the second metal bump, wherein electrical component is a device die or a package substrate.

11. The method of claim 10, wherein after the step of bonding the electrical component, a ratio of a horizontal size of the second metal bump to a horizontal size of the first metal bump is greater than about 5.

12. The method of claim 10, further comprising filling an underfill between the electric component and an uppermost surface of the dielectric layer.

13. The method of claim 7, further comprising filling an underfill between the wafer and the first die before the step of forming the dielectric layer.

14. A method of forming a device, the method comprising:
   forming a first under-bump-metallurgy (UBM) and a second UBM over a first side of a substrate;
   forming a first metal bump over and electrically coupled to the first UBM;
   bonding a first die to the first metal bump;
   forming a dielectric layer covering the first die, the second UBM and the substrate;
   forming an opening in the dielectric layer to expose at least a portion of the second UBM; and
   forming a second metal bump in the opening and electrically coupled to the second UBM, wherein the second metal bump is larger than the first metal bump, and wherein the second bump extends through the dielectric layer.

15. The method of claim 14, wherein a portion of the second metal bump extends above a topmost surface of the dielectric layer.

16. The method of claim 14, further comprising bonding an electrical component to the second metal bump, wherein electrical component is a device die or a package substrate.

17. The method of claim 16, further comprising filling an underfill between the electric component and an uppermost surface of the dielectric layer.

18. The method of claim 16, wherein after the step of bonding the electrical component, a ratio of a horizontal size of the second metal bump to a horizontal size of the first metal bump is greater than about 5.

19. The method of claim 14, further comprising:
   forming a through via through the substrate and extending from the first side of the substrate to a second side of the substrate opposite the first side, the through via in electrical contact to the first UBM.

20. The method of claim 19, further comprising:
   bonding a second electrical component to the second side of the substrate, the second electrical component electrically coupled to the die through the through via and the first UBM.

* * * * *